United States Patent [19]

Simon

[11] Patent Number: 5,400,118
[45] Date of Patent: Mar. 21, 1995

[54] PROCESS AND APPARATUS FOR PRINTING PERIODICALS AND THE LIKE

[75] Inventor: Michael J. Simon, Louisville, Ky.

[73] Assignee: Publishers Press, Inc., Louisville, Ky.

[21] Appl. No.: 978,512

[22] Filed: Nov. 18, 1992

[51] Int. Cl.$^6$ .................... G03B 27/62; G03B 27/64
[52] U.S. Cl. ........................ 355/76; 355/47; 355/73; 355/104
[58] Field of Search ............... 355/32, 35, 88, 47–49, 355/85, 76, 104, 110, 73; 101/378, 382.1; 346/125, 138

[56] References Cited

U.S. PATENT DOCUMENTS

| | | |
|---|---|---|
| 2,139,956 | 12/1938 | Huebner . |
| 2,497,991 | 2/1950 | Huebner . |
| 2,638,040 | 5/1953 | Murphy . |
| 2,692,540 | 10/1954 | Bing et al. . |
| 2,774,289 | 12/1956 | Collins . |
| 3,176,601 | 4/1965 | Bradley . |
| 3,234,868 | 2/1966 | Appledorn et al. . |
| 3,545,860 | 12/1970 | Hutchins . |
| 3,584,955 | 6/1971 | Stievenart et al. ............ 355/84 |
| 3,642,368 | 2/1972 | Moss ............................ 355/47 |
| 3,644,039 | 2/1972 | Boyer, III .................... 355/85 |
| 3,682,551 | 8/1972 | Bradley et al. ............... 355/120 |
| 4,264,192 | 4/1981 | Robb ............................ 355/324 |
| 4,334,770 | 6/1982 | Landsman ..................... 355/104 |
| 4,526,463 | 7/1985 | Hickey et al. ................ 355/83 |
| 4,529,303 | 7/1985 | Ternes ......................... 355/91 |
| 4,585,340 | 4/1986 | Buckingham ................. 355/91 |
| 4,586,978 | 5/1986 | Kondo et al. ................ 156/540 |
| 4,721,383 | 1/1988 | Simon .......................... 355/91 |
| 5,243,379 | 9/1993 | Lein ............................. 355/85 |
| 5,329,301 | 7/1994 | Balzeit et al. ................ 346/134 |

OTHER PUBLICATIONS

*Pocket Pal a graphic arts production handbook*, International Paper Company, 1989.
Excerpt by Optronics An Intergraph Division entitled *Color Getter*, Intergraph Corporation, 1990.
*Linotype Connection*, Published by Linotype Company, vol. 4, No. 2, Summer 1990.

*Primary Examiner*—Richard A. Wintercorn
*Attorney, Agent, or Firm*—Banner, Birch, McKie and Beckett

[57] ABSTRACT

A method for imaging film with color separations and text which eliminates manual stripping and the use of mylar carriers. Color separation data from a color scanner is stored digitally on a computer. Text is input directly into the computer. The data for the images and text is manipulated digitally to compose a page layout. The computer then instructs an image setter to image the complete, composed page onto four pieces of film in the four color printing colors—cyan, magenta, yellow and black. The imaged film is used to make lithographic printing plates for color printing. The image setter used in the method includes a specially pinned drum having pins corresponding to pins used during imposition. Blank film has prepunched holes corresponding to the pins on the pinned drum so that the imaged film comes off of the drum with images and text in position and register relative to the pin holes. The labor intensive steps of manually stripping film onto mylar carriers is eliminated.

12 Claims, 9 Drawing Sheets

PROCESS AND APPARATUS FOR PRINTING PERIODICALS AND THE LIKE

FIELD OF THE INVENTION

The present invention pertains to a process for producing printing plates, in particular to a process specially adapted for the publication of periodicals or the like. The present invention also pertains to a pinned drum for use in the process.

BACKGROUND OF THE INVENTION

The modem printing industry primarily employs a planographic method of printing. In this type of process, the image and non-image areas of the printing plates are on the same plane of a thin metal plate. In older processes, plates were provided with variations on their surface, such as depressions or raised sections, to distinguish between the image and non-image areas. In contrast, the planographic method maintains the distinction by chemical means. To make a plate, one begins with a metal plate having a photo polymer coating which is presensitized to UV light. The plate and a piece of film with an image on it are exposed to UV light such that the photo polymer under the image is hardened according to the design of the image. The hardened parts of the photo polymer remain on the plate while the other parts are removed by known chemical processes. The hardened parts which attract ink become the image areas, and the other parts which repel ink become the non-image areas. These areas are commonly said to be "ink-loving" and "water-loving."

In printing color images, the colors are separated into four colors by a color scanner—namely, cyan, magenta, yellow and black. Other colors are produced through various combinations of these four colors. A separate printing plate must be produced for each of the four colors. In the printing process, the paper is sequentially printed by each of the four plates in an overlapping relationship to produce an image which colorfully reflects or simulates an original continuous tone image. Since a separate plate must be produced for each color, it is critical that the images on the plates be properly positioned so that the printed product will have sharp, clear images.

A conventional process for printing periodicals or the like is begun by producing a relatively large piece of film called an imposition flat. The imposition flat is similar in size to the printing plate and is ultimately used to expose the plate as discussed above. The plates are used to print forms. A form is a large sheet of paper with the pages positioned on it such that once printed, they can be trimmed and folded into pages of a publication. A four page form 10 as illustrated in FIG. 1 will be used for ease of explanation. However, printing is done with anywhere from two to sixty four pages on each side of a sheet of paper defining a form. Producing the large imposition flat used to create the form has heretofore been an exacting process. An imposition flat consists of a number of pages of the finished printed product laid out in the configuration desired for the form. The size and configuration of the layout or imposition flat is determined in a planning stage when the number of pages to be printed is decided.

FIG. 2A is a flow-chart illustrating a conventional process for producing printing plates. For producing page 1 of the form 10, one first inputs a color transparency of an original color image into a color scanner. The color scanner separates the image into the four colors, corrects the colors and adjusts them for printing conditions such as inks, paper, and tonal range. The scanner communicates electronically with an image setter to output a piece of film with four images—one in each of the separated and corrected colors—of the inputted transparency. An image setter images the color separations onto the film by a laser. The film is mounted on an imaging drum which spins the film at a rapid rate while the color scanner instructs a laser head to turn on and off. The laser in affect operates to "draw" the image on the film.

The film, which is substantially the size of the surface area of the drum, is typically attached to the drum by a lead edge pin and a vacuum system. The pins on the drum are typically aligned along a lead line on the drum. Pin holes are formed along the lead edge of the film to correspond to the position of the pins on the drum. The lead edge pin holes in the film function to attach the film to the drum and thus draw the film through the image setter. The drum also has machined grooves which serve as vacuum channels. The channels are commonly machined to be located around the periphery of the mounted film. The channels have small holes which are part of a vacuum distribution system. When the image setter is activated, a vacuum is drawn through the holes in the channels to securely hold the film to the surface of the drum.

The text for page 1 is output to another piece of film 53 (FIG. 9) using a text output device such as a Linotype 300 manufactured by The Linotype Co. of Hauppauge, N.Y.

Once the separated images are on the film, one image per color, the film is cut apart 50a–50d and 51a–51d (FIG. 8) for registration and assembly. Registration and assembly are manual processes which require (1) the image films to be stripped in register onto carriers for assembly, and (2) the assembled images to be exposed to a specific spot on a larger piece of film to form an imposition flat.

Stripping the image films in register entails the manual positioning and taping of the image film and text film to mylar carriers 52a–52d, 54 (FIGS. 8–10). Each of the mylar carriers have pin holes 55 and 56 along the top and bottom edges of the sheets, respectively. Registration of the films is accomplished by use of the pin holes 55, 56 in the mylar sheets and pins 41 fixed on a light table 40.

Referring to the assemblies of FIGS. 9 and 10, the image films 50a–50d, 51a–51d and the text film 53 for page 1 are taken to the light table 40 onto which a sheet of mylar 52a has been placed with pin holes 55 and 56 received over pins 41 (FIG. 11). The image films 50a, 51a for one color, for example cyan, are attached by tape 57 to the mylar 52a in the proper positions for the page. In the drawings, two spaced apart images are illustrated in position over a text portion. This arrangement is merely exemplary. The orientation of the images and text of course varies from page to page. After the proper placement of the images of one color, another sheet of mylar 52b is put on top of the first assembly 50a, 51a, 52a, using pin holes 55 and 56 (FIG. 11). The image films 50b, 51b for the next color, for example magenta, are visually positioned in exact register to the first 50a, 51a and then manually taped to the second sheet of mylar 52b. The second sheet of mylar 52b is then removed, and a third sheet of mylar 52c is put on top of the first assembly 50a, 51a, 52a with pin holes 55 and 56 received over the pins 41. The third image films 50c, 51c for the next color, for example yellow, are also visually positioned onto the third sheet of mylar 52c, and manually taped to it. These steps are repeated to properly position and tape the fourth image films 50d, 51d onto the fourth sheet of mylar 52d. The text film 53 is also visually positioned, in a desired location, onto a sheet of mylar 54 and taped. Since the mylar carriers 52a–52d and 54 were all engaged to the same set of pins on the light table, the image films 50a–50d, 51a–51d and 53 are in register with respect to the pin holes 55 and 56 in the mylar carriers.

The steps of scanning, separating, imaging, visual positioning and taping onto carriers must be repeated for each page of the form. As a result, the production of a four page form requires a total of twenty mylar sheets, four color separations and one text for each page. All of the mylar sheets for one page will be in register with respect to the pin holes.

Once the image films for the form are in register on the mylar carriers they are imposed on a larger piece of film or directly onto a plate. One imposition process involves a step and repeat machine. All mylar carriers having the image films of one color, for example cyan, for each of the four pages are hung in turn on a camera chase by the pin holes in the mylar carriers. A larger piece of film or a plate are usually held on the machine with a vacuum during exposure. The image films are exposed to the larger piece of film or directly to the plate at a predetermined positions to create an imposition flat or printing plate. The step and repeat machine uses a coordinate system to locate the positions for the exposures. The resulting imposition flat (FIG. 3) has all four pages on it for the one color, in this case cyan. Likewise, all mylar carriers having the image films of another color, for example magenta, for each of the four pages are also hung in turn on a camera chase by the pin holes in the mylar carriers, and exposed to a larger piece of film or the plate at predetermined positions. The resulting imposition flat or printing plate has all four pages on it for magenta. The same steps are repeated for the yellow images, the black images, and the text films.

If imposition was done directly onto the plates, the plates are ready to be used in conventional offset lithography. If imposition flats are made for each color and for the text, the flats are used to produce the metal printing plates (FIG. 4) for each respective color. For example, the cyan imposition flat is used to expose a printing plate which is processed and thereby results in a plate which will print the color cyan onto the paper. The magenta imposition flat is used to expose a printing plate and produce the plate which will print the color magenta on the paper, and so on. The printing plates can then used in conventional offset lithography. Versions of the step and repeat machines having various degrees of automation are known.

As can be appreciated, the printing process is highly manual. In particular, stripping the image films in register on a light table is very repetitious and time consuming.

Another conventional method of producing printing plates is illustrated in the flow-chart in FIG. 2B. In this method, all of the pages of a form must be planned and laid out before commencing. The color images and text for all of the pages of the form are input to the color scanner. The color scanner separates the images into the four colors.

Typically a large piece of film with pin holes on its leading edge is attached to a correspondingly large drum of an image setter. The image setter is instructed by the color scanner to image the large piece of film corresponding to the form, producing a film form, for each color. The imaging is generally done one color at a time. In other words, the film form that comes out of the image setter will have the images and text for all of the pages of a form. Four of these film forms will be produced, one for each color: cyan, magenta, yellow and black with the text on it. Each of the pages will have the images and text in position and register with respect to themselves. The pin holes provide a registry system for the entire form or block of pages but not the individual pages.

In the production of periodicals, the film form must still ordinarily be cut apart for the imposition step. The individual films must still be put on mylar carriers having pin registry holes which correspond to the pins used to create an imposition flat. A particular color film must be placed on a mylar carrier in position and register to the other color films for that page. The process is similar to the stripping done in the previously discussed prior art method, although it is somewhat simplified since all the images for a color on a particular page and the text are in register with each other on one piece of film. Yet, until the pages are positioned and attached to the mylar carriers, the different colors are not in register with each other. Hence, although the film is imaged with all page elements, the manual assembly on carriers is still required.

A few book publishers have developed specialized apparatus for creating imposition flats directly from the imaged film; that is, without the mylar carriers. The imposition apparatus is constructed to support the entire eight page films in register with one another. The lead holes on the film are used to align the different colors in register. This method, however, requires all of the pages for the film form to be laid out and ready to print before the pages are scanned or imaged. Since eight consecutive pages are imaged to the same film which is directly used to make the printing sheet, the process fails to accommodate the insertion of advertisement pages which are frequently available only just before printing. As a result, no time is generally available to digitalize the advertisement and print the film in time to make the mailing deadlines. Consequently, this process is limited to some types of book publishing, and is not practical for use in the periodical printing industry.

SUMMARY OF THE INVENTION

The present invention pertains to a printing process and in particular to a process especially adapted for publishing periodicals and the like. The process entails a unique way of producing a printing plate which eliminates the manual registration and assembly steps. There is no longer any need to prepare the various pieces of film in register onto mylar carriers. In fact, carriers are not used at all. Instead the pinned imaging drum images single-page film in register relative to pin holes provided in the film.

The present invention allows for the simultaneous imaging of all four colors onto four pieces of film for an individual page; or the imaging of four pages of the same color. Indeed, any combination of colors or pages could be imaged at the same time in the present invention. Since individual pages are imaged, the work of scanning and imaging can advance regardless of whether all of the pages for a form are ready or not. As a result, late arriving advertisement can easily be inserted in the periodical without disruption. The pages can be scanned and imaged as they are prepared and used to make the flats at a later time.

The present invention uses film generally the size of an individual page. The film defines a pin hole at the top and bottom of the sheet. The drum in the image setter defines a plurality of separate mounting areas (preferably four) each with a pair of spaced apart pins corresponding to the holes in the sheets of film. The image setter images the single-page sheets of film such that the images on the page and text (if in the same color as the images) are in register with each other and with the holes defined in the film. This process results in a great time savings as compared to the prior method in which the images for each color had to be manually aligned and attached to the mylar.

In the present invention, the color scanner separates the images into four colors and stores the information in digital form as a digital file. An artist uses a version of this file to position the images and text electronically so that the pages are organized in the desired manner. This system would allow for numerous changes in format before the final lay-out is selected. Once the artist positions the images and text on the page as desired, the information is stored on a computer disk. The computer is then used to control the image setter for creating the desired images in their proper positions on the page.

The image setter of the present invention comprises a specially pinned drum designed to support the plurality of single-page sheets of film. More specifically, a plurality of pieces of film (preferably four) are mounted on the drum by placing the holes over the pins on the drum. The drum further uses a vacuum system to hold the sheets securely to the drum. The image setter receives its instructions from the computer to "draw" on the sheets of film. Each sheet of film produced by the image setter represents one color of one page to be printed for the periodical. The images and perhaps text are printed on the film in register with each other and with the drum pins, and hence, the holes defined in film sheets.

To effect imposition of the film, the sheets of film are placed directly on a camera chase using the same pin positions as designed for the mylar carriers. Consequently, a large imposition flat is produced without stripping or the use of carriers. The flat is then used to make the printing plate by conventional means. The imposition operation can also image the pages directly onto printing plates without the fabrication of a flat if desired. By this process, the tedious task of manually assembling the film onto mylar carriers is eliminated, and the production is substantially simplified and streamlined. Yet despite the marked absence of previous manual steps, the present invention uses substantially the same machines to produce the printing plate which allows for a quick and economical conversion to this system. Moreover, late arriving advertisement pages can easily be incorporated into the publication since each page is imaged in register as a completely independent entity.

These and other objects, advantages and features of the present invention will be more fully understood and appreciated by reference to the written specification and appended drawings.

DETAILED DESCRIPTION OF THE PREFERRED EMBODIMENTS

Figure 2A:
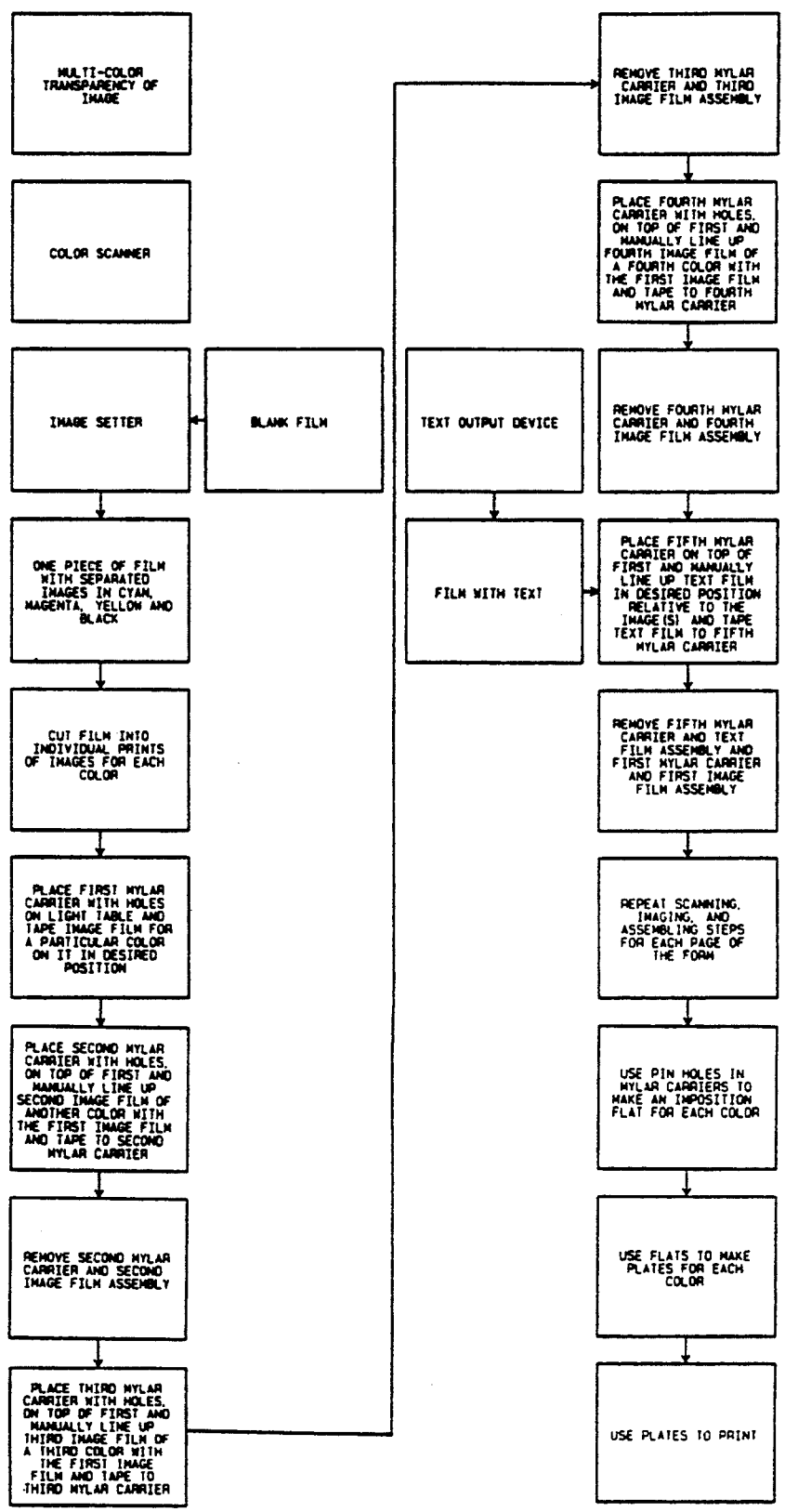
FIG. 2A is a flow-chart of a conventional printing process.
Figure 2B:
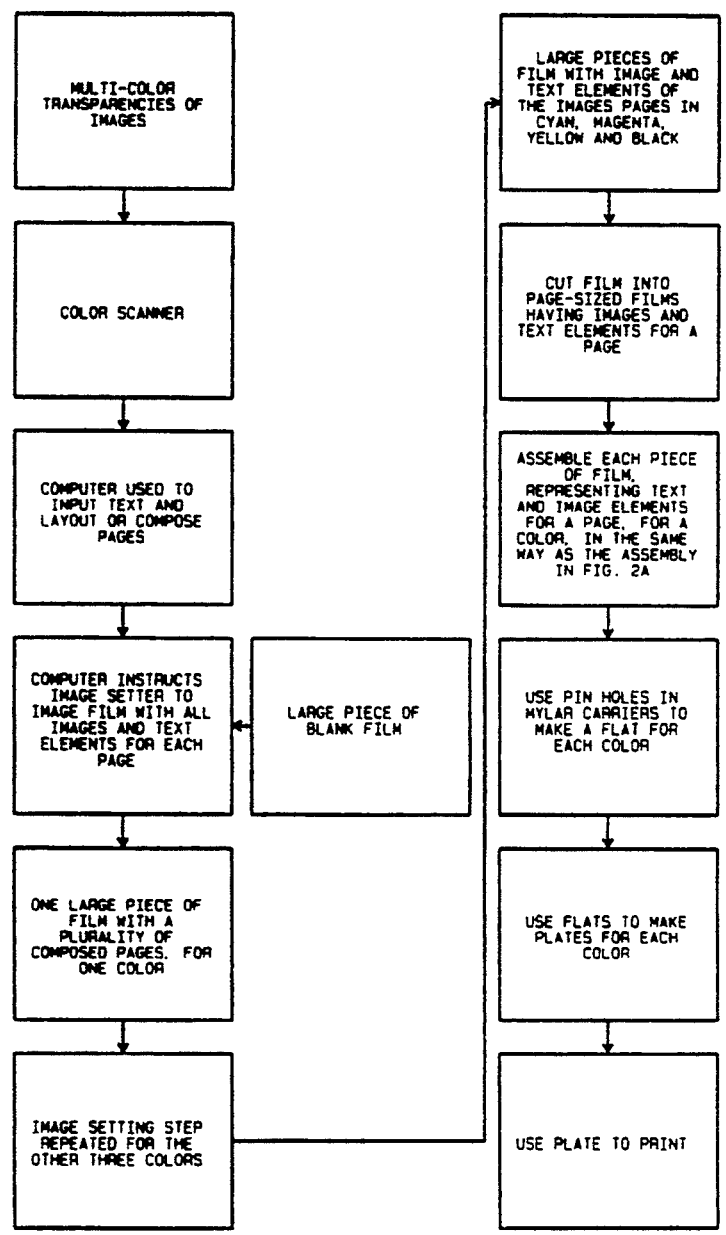
FIG. 2B is a flow-chart of another conventional printing process.
Figure 2C:
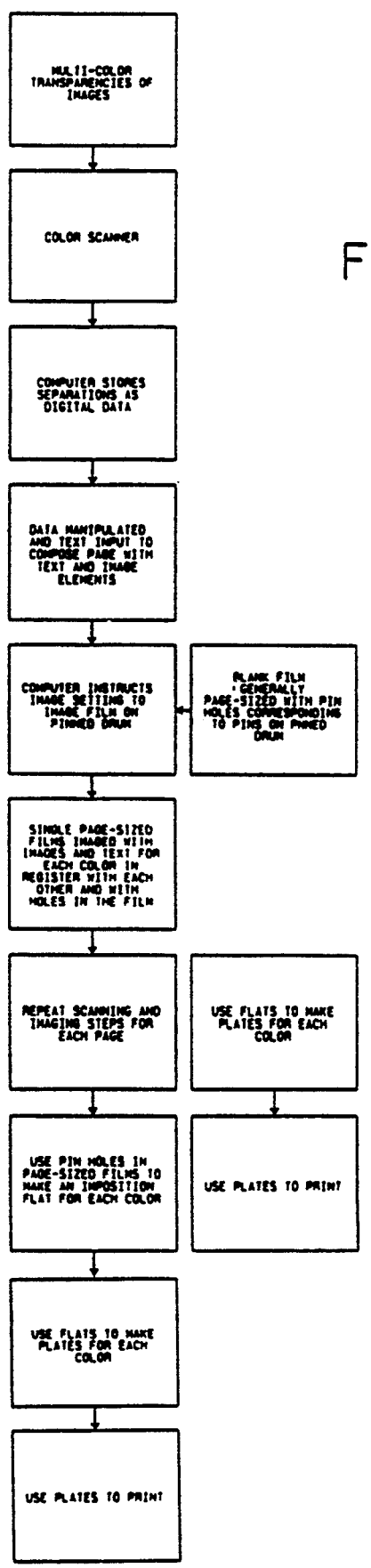
FIG. 2C is a flow-chart of a printing process according to the present invention.

The flow-chart in FIG. 2C represents the process steps of the present invention. As in a conventional process, a color transparency of the original image is input into the scanner and the scanner separates the image into the four colors, corrects the colors and adjusts them for printing conditions. In the present invention, the scanner communicates electronically with a computer to store these separated images digitally. The digitally stored data for the separations is put on a disk. The stored information is then used by an artist to compose the images for a page layout in a manner known in the printing industry. Text can also be composed on the page and stored as part of the data file for the page. Composing the page on a computer allows for flexibility and creativity as the layout for the images and text can be manipulated and changed. Once the page is composed, the artist stores the information for that page on a data file.

The process of the present invention uses a computer to process the data file containing the composed page and communicate electronically with an image setter having a specially pinned drum, according to the invention, to output a plurality of sheets of film (preferably four)—one for each page.

Single-page sheets of blank film with pin holes 15, 16 are mounted on an imaging drum (FIGS. 6 and 7) for imaging the sheets as independent entities. The drum 20 consists of a cylindrical member supported for a controlled rotation about a central axle. The outer peripheral surface of the drum defines a plurality of mounting areas or stations 24a–24d for supporting the sheets of film; that is, one mounting area for each single-page sheet of film. Each mounting area 24a–24d includes a pair of spaced apart pins 27, 28 for receiving the holes 14, 16 defined along the top and bottom edges of the film sheets. The positioning of the film with these pins permits the images and text to be imaged directly in register with each other and with the holes for each sheet. As a result, the sheets are passed out of the image setter as a complete and independent entity readily positioned at any particular position in the periodical. The hole 16 at the top edge is preferably round and the hole 15 at the bottom edge is preferably oblong in shape. The film is loaded on the drum under darkroom conditions, and this configuration provides a means to easily determine the top and bottom of the film and facilitate placement of the sheets onto the pinned drum. This arrangement further allows for variations in the film's length due to temperature and humidity changes.

Figure 6:
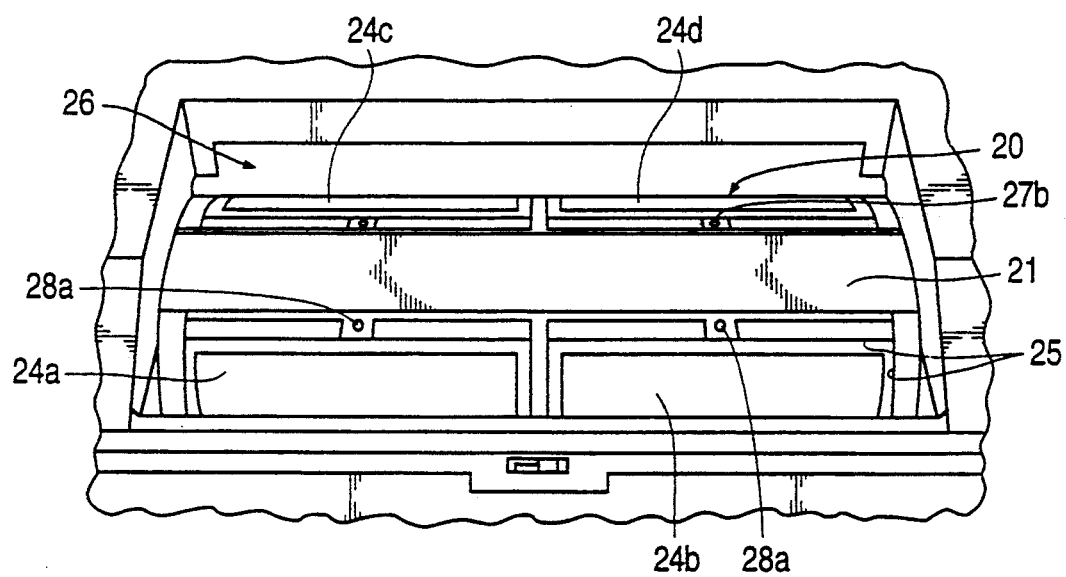
FIG. 6 is a top plan view of a pinned imaging drum according to the present invention positioned in an image setting device.
Figure 7:
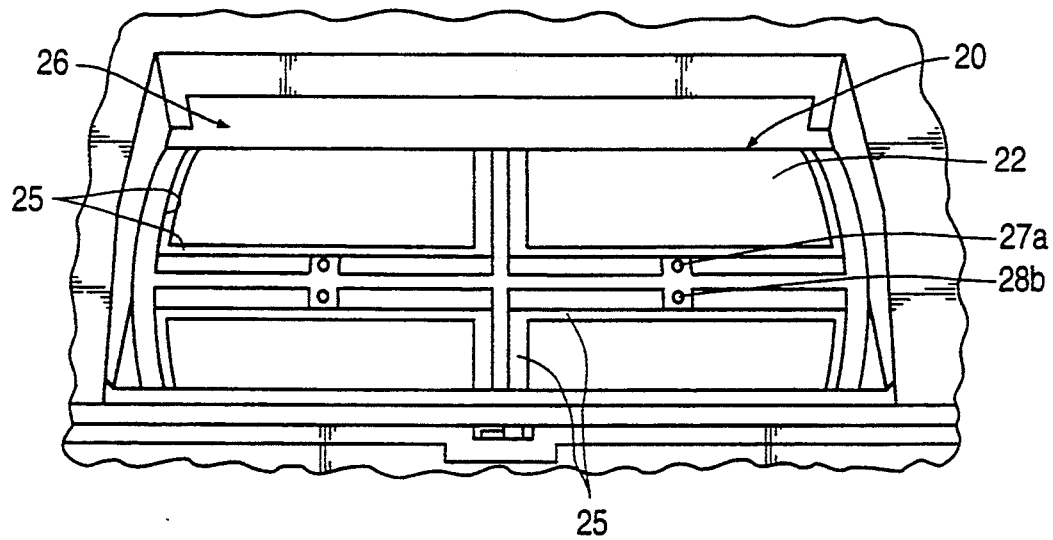
FIG. 7 is a bottom plan view of a pinned imaging drum according to the present invention positioned in an image setting device.
Figure 9:
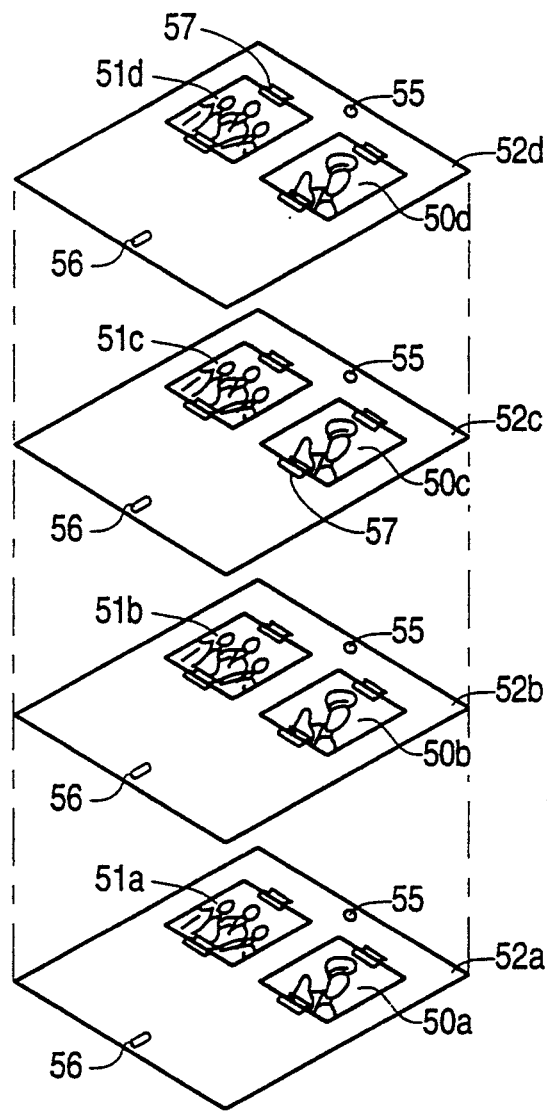
FIG. 9 is a perspective view of image films mounted on mylar carriers used in the prior art process.
Figure 10:
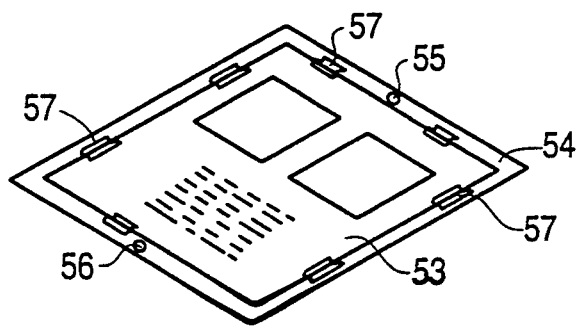
FIG. 10 is a perspective view of a text film mounted on a mylar carrier used in the prior art process.
Figure 11:
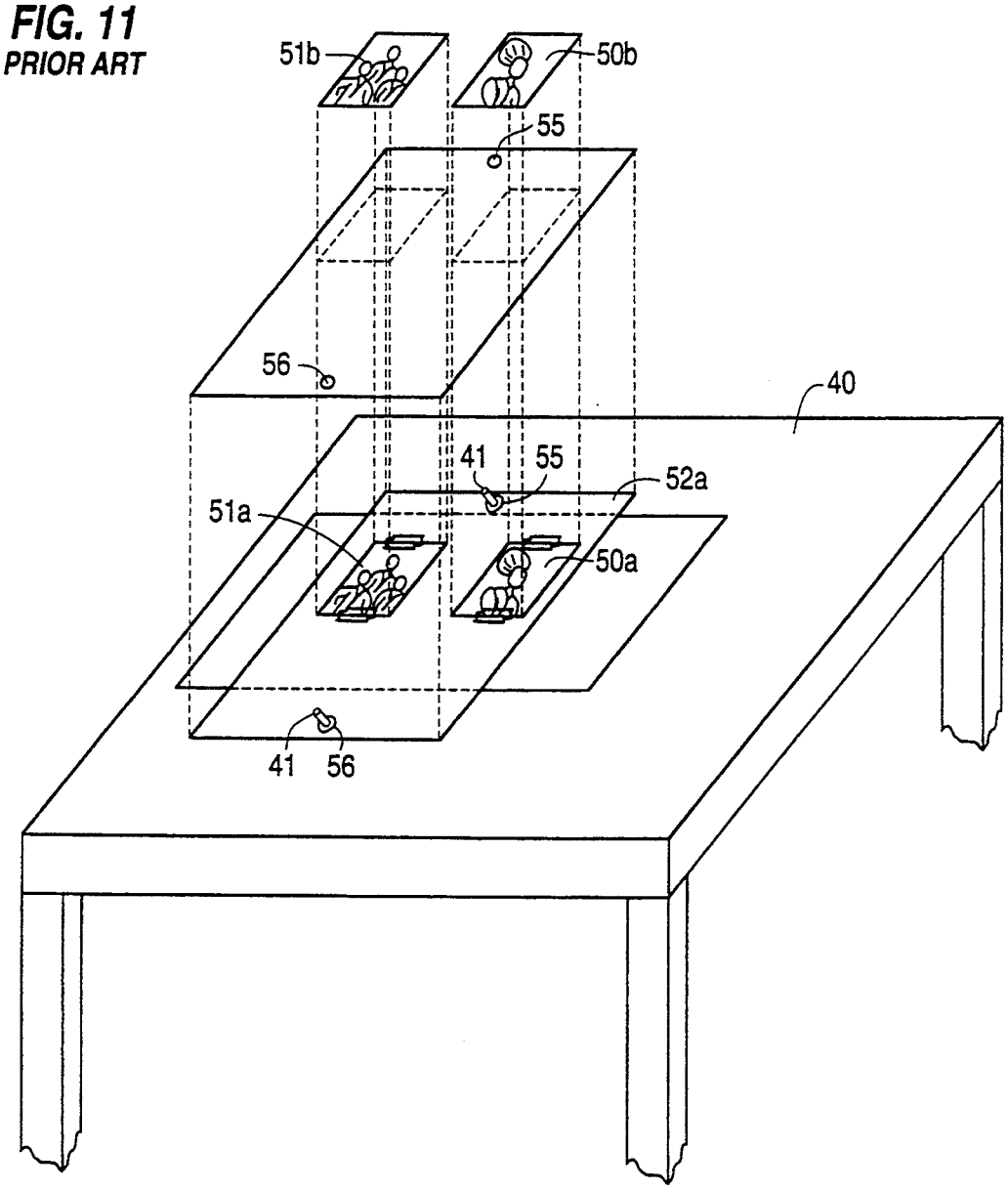
FIG. 11 is a perspective view the manual step of bringing a mylar carrier and image film in register with an assembly already on a light table.

The drum 20 further includes vacuum channels 25 at each mounting area to securely hold the film to the drum in a known manner (FIGS. 6 and 7). The channels 25 are located around the periphery of each mounting area such that channels are around the periphery of each piece of film which is mounted to the drum. In contrast to the prior art drum in which channels typically extend around the periphery of where a large piece of film would be mounted, the channels are arranged to hold single-page sheets of film. As a result, the pinned drum of the present invention generally has more vacuum channels on the surface of the drum than prior art drums. The channels are connected to a vacuum means (not shown) in the image setter.

Figure 5:
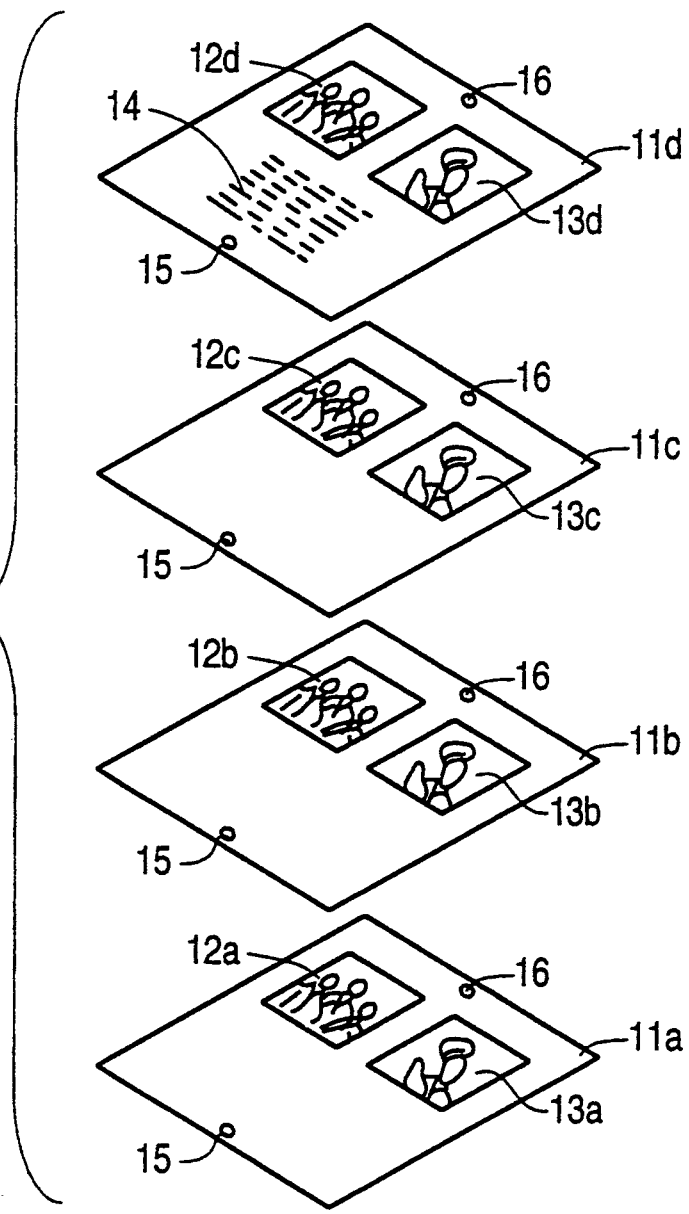
FIG. 5 is a perspective view of image films produced according to the present invention.

The computer uses the data in the data file to instruct the image setter to image all page elements of a color for a composed page onto a single-page sheet of film. The images (and text if in that color) are imaged on the film for the entire page in their proper positions. The text is generally included on the sheet imaged for the color black. The images and text are printed in register relative to the pins 27, 28, and hence the pin holes 15, 16 in the film. The single-page sheets of film come out of the image setter with the images and text in register relative to the pin holes 15, 16 (FIG. 5), and ready to be used to make an imposition flat. By using the pinned drum of the present invention, the steps of manually cutting film into separate pages or images and aligning the images onto mylar carriers is eliminated.

As can be seen in FIGS. 6 and 7, image setting devices typically define an opening 26 exposing a portion of the drum for loading and unloading the film. The operator mounts the film on the drum by engaging the top round holes 16 of two pieces of film onto the round pins 28a on the top of the drum 21. The drum is then rotated so that the bottom slotted holes 15 of the same two pieces of film are placed over the elongate pins 27a on the bottom of the drum 22. This places two sheets of film on film mounting areas 24a, 24b. The pins 27a are preferably shorter in length than the holes to accommodate some variation in film size caused by changes in temperature and humidity. The top holes 16 of the next two pieces of film are then engaged onto the round pins 28 on the bottom of the drum. The drum is rolled so the top 21 shows again, and the bottom slotted holes 15 of the second two pieces of fill are engaged onto the elongate pins 27b. This places a sheet of fill in each of the fill mounting areas 24c, 24d. Of course other numbers and arrangements of mounting areas could be used. The four pieces of film are mounted in this manner, and when imaged, the fill will contain four different colored images of the same page 11a–11d (FIG. 5), four different pages of the same color or any other desired combination of colors and pages. The film mounting and imaging is repeated until all four colors of all of the pages of the periodical have been imaged.

Figure 1:
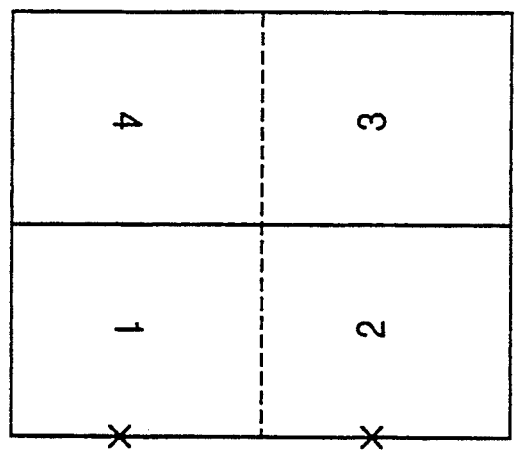
FIG. 1 is a schematic of a four page form.
Figure 3:
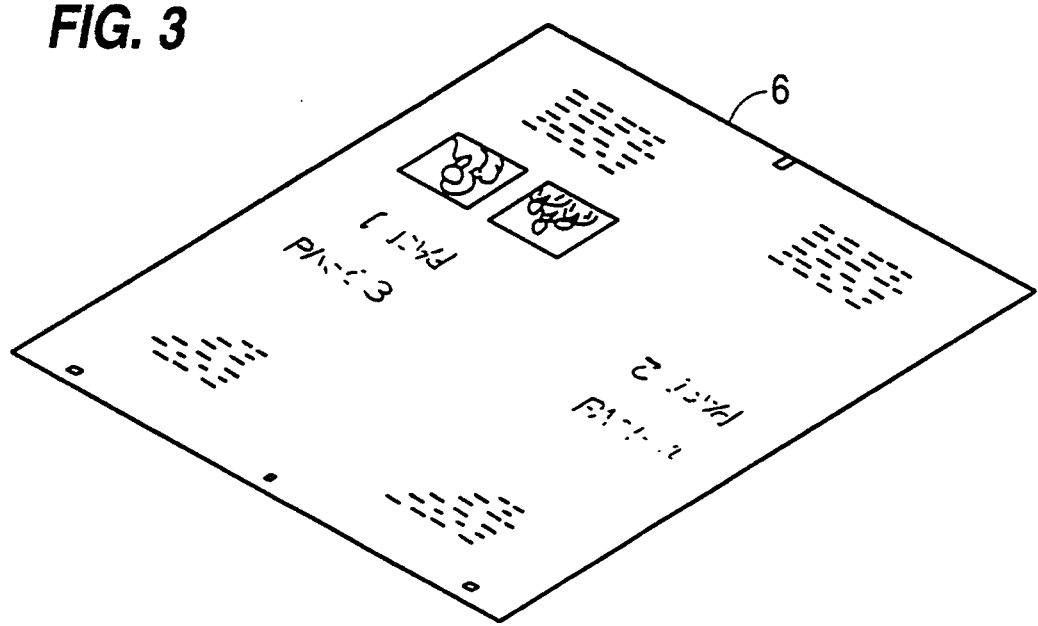
FIG. 3 is a perspective view of an imposition flat for a four page form.
Figure 4:
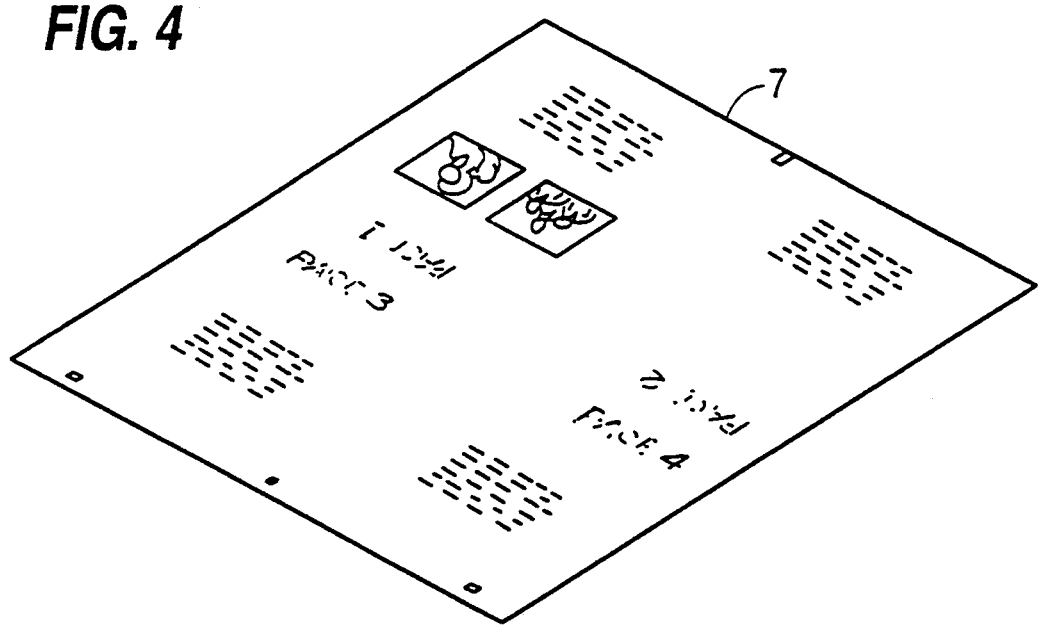
FIG. 4 is a perspective view of a printing plate for a four page form.
Figure 8:
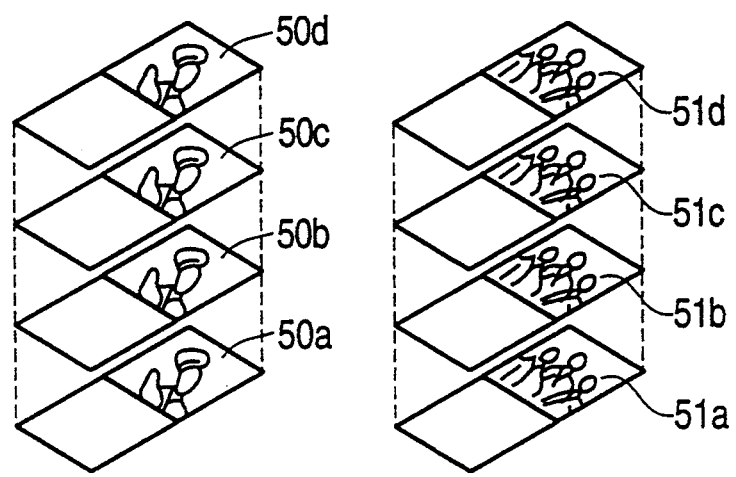
FIG. 8 is a perspective view of image films used in the prior art process.

Once the films are ready, they will be imposed either on an imposition flat 6 (FIG. 3) or directly onto a plate 7 (FIG. 4) using a conventional imposition process. Four imposition flats 6 or plates 7 will be made. If flats are made, they will each be used to make a priming plate 7 (FIG. 4). As in the conventional process, a printing plate must be made for each of the ink colors, cyan, magenta, yellow and black. The plates are then used in offset lithography.

In the present invention, no carriers are necessary as the film itself is imaged directly in position and register relative to the pin holes defined in it. The steps of using a light table to visually align image films on to mylar are eliminated. As can be appreciated, the elimination of manual labor steps results in significant economic advantages. Precision, quality and repeatability are enhanced because of digitalization of data.

In many fields of printing, the copy cannot be preplanned to a high degree. Publishers of periodicals rarely have all the pages of a form planned and ready for scanning and imaging at the same time. In any printing environment in which there is late arriving material or last minute changes to copy, the method of the present invention provides many advantages. The scanning, composing and imaging of individual pages allows for the process to continue even if all of the pages are not completed. There is no longer a need to wait until all of the pages are composed and planned before progressing to the next step in the process. Since the present invention is a single page process, pages can be imaged and ready to impose as the composition is completed. Late arriving material such as advertisements, for example, can be scanned and imaged after all the other pages are ready. Further, changes to any pages only means having to redo the particular pages, and not whole flats or forms.

The above-discussed embodiment is merely a preferred embodiment of the present invention. Other embodiments as well as many changes and alterations may be made without departing from the spirit and broader aspects of the invention.

I claim:

1. An imaging drum for use in an image setting device, said drum comprising:
   a cylindrical drum body defining an outer peripheral surface;
   means for mounting said cylindrical drum body for rotation about an axis centrally positioned with respect to said peripheral surface of said drum body;
   a plurality of single-page film mounting areas disposed on said peripheral surface of said drum body, each film mounting area being adapted to receive a single-page sheet of film,
   a plurality of spaced apart pins projecting radially outward from said peripheral surface of said drum body at each film mounting area such that a plurality of pins is adapted to mount each single-page sheet of film; and
   a plurality of vacuum channels defined in said peripheral surface of said drum body such that a set of vacuum channels are provided at each film mounting area to securely hold the single-page sheets of film to said drum.

2. The imaging drum of claim 1, in which said drum body includes at least one film mounting area defined on a first arcuate segment of said peripheral surface and at least one film mounting area defined on a second arcuate segment of said peripheral surface, wherein said first and second arcuate segments are offset from one another in the direction of rotation of said drum body.

3. The imaging drum of claim 2, in which a plurality of film mounting areas are defined in each arcuate segment of said peripheral surface of said drum body.

4. The imaging drum of claim 2, in which each of said film mounting areas defines a leading edge and a trailing edge with respect to the rotation of said drum body, and in which each mounting area includes a first pin located adjacent the leading edge and a second pin located adjacent the trailing edge.

5. The imaging drum of claim 4, herein each said pin adjacent said leading edge of each film mounting area is proximate to a pin adjacent said trailing edge of another film mounting area.

6. The imaging drum of claim 1, in which each of said film mounting areas defines a leading edge and a trailing edge with respect to the rotation of said drum body, wherein each mounting area includes a first pin located adjacent the leading edge and a second pin located adjacent the trailing edge, and wherein each said pin adjacent said leading edge of each film mounting area is proximate to a pin adjacent said trailing edge of another film mounting area.

7. The imaging drum of claim 1, in which said peripheral surface of said drum body defines a plurality of arcuate segments, said arcuate segments being arranged in a seriatim manner with respect to the direction of rotation of said drum body, wherein each of said arcuate segments includes at least one film mounting area.

8. The imaging drum of claim 7, in which a plurality of film mounting areas are disposed in each of said arcuate segments of said drum body peripheral surface.

9. An image setting device comprising:
a drum including:
a cylindrical drum body defining an outer peripheral surface;
means for mounting said cylindrical drum for rotation about an axis centrally positioned with respect to said peripheral surface of said drum body;
a plurality of single-page film mounting areas disposed on said peripheral surface of said drum body, each film mounting area being adapted to receive a single-page sheet of film,
a plurality of spaced apart pins projecting radially outward from said peripheral surface of said drum body at each film mounting area such that a plurality of pins is adapted to mount each single-page sheet of film; and
a plurality of vacuum channels defined in said peripheral surface of said drum body such that a set of vacuum channels are provided at each film mounting area to securely hold the single-page sheets of film to said drum;
means for rotating said drum;
means for creating a vacuum in said vacuum channels; and
means for imaging the single-page sheets of film mounted on said drum.

10. The image setting device of claim 9, in which each of said film mounting areas of said drum defines a leading edge and a trailing edge with respect to the rotation of said drum body, wherein each mounting area includes a first pin located adjacent the leading edge and a second pin located adjacent the trailing edge, and wherein each said pin adjacent said leading edge of each film mounting area is proximate to a pin adjacent said trailing edge of another film mounting area.

11. The image setting device of claim 9, in which said peripheral surface of said drum body defines a plurality of arcuate segments, said arcuate segments being arranged in a seriatim manner with respect to the direction of rotation of said drum body, wherein each of said arcuate segments includes at least one film mounting area.

12. The image setting device of claim 11, which a plurality of film mounting areas on said drum are disposed in each of said arcuate segments of said drum body peripheral surface.

* * * * *